US012237193B2

(12) United States Patent
Gu

(10) Patent No.: US 12,237,193 B2
(45) Date of Patent: Feb. 25, 2025

(54) GAS-INLET MODULE AND GAS-INLET NOZZLE

(71) Applicant: Brillian Network & Automation Integrated System Co., Ltd., Miaoli County (TW)

(72) Inventor: Yi-Jun Gu, Miaoli County (TW)

(73) Assignee: BRILLIAN NETWORK & AUTOMATION INTEGRATED SYSTEM CO., LTD., Miaoli County (TW)

( * ) Notice: Subject to any disclaimer, the term of this patent is extended or adjusted under 35 U.S.C. 154(b) by 405 days.

(21) Appl. No.: 17/875,944

(22) Filed: Jul. 28, 2022

(65) Prior Publication Data

US 2024/0038562 A1 Feb. 1, 2024

(51) Int. Cl.
*H01L 21/673* (2006.01)
*H01L 21/677* (2006.01)

(52) U.S. Cl.
CPC .. *H01L 21/67393* (2013.01); *H01L 21/67386* (2013.01); *H01L 21/6773* (2013.01)

(58) Field of Classification Search
CPC ......... H01L 21/67775; H01L 21/67389; H01L 21/67017; H01L 21/67393
See application file for complete search history.

(56) References Cited

U.S. PATENT DOCUMENTS 6,287,178 B1 * 9/2001 Huynh ...................... B08B 3/02 451/73
6,899,145 B2 * 5/2005 Aggarwal ......... H01L 21/67393 141/69
2014/0041755 A1 * 2/2014 Chou ................ H01L 21/67393 141/113
2023/0420272 A1 * 12/2023 Kotsugai ........... H01L 21/67017
2024/0038559 A1 * 2/2024 Gu .................... H01L 21/67775

FOREIGN PATENT DOCUMENTS

CN 106684023 A 5/2017
CN 207966953 U 10/2018
TW M382405 U1 6/2020

* cited by examiner

*Primary Examiner* — Timothy P. Kelly
(74) *Attorney, Agent, or Firm* — Li & Cai Intellectual Property (USA) Office

(57) ABSTRACT

A gas-inlet module and a gas-inlet nozzle are provided. The gas-inlet has a first gas-inlet channel and a second gas-inlet channel. The first gas-inlet channel has a first end opening, the second gas-inlet channel has a second end opening, and a distance between a center point of the first end opening and a center point of the second end opening is defined as an offset distance. A value defined by an inner radius of the first end opening or an inner radius of the second end opening divided by the offset distance is within a range from 1/7 to 5/7.

9 Claims, 11 Drawing Sheets

GAS-INLET MODULE AND GAS-INLET NOZZLE

FIELD OF THE DISCLOSURE

The present disclosure relates to a gas-inlet nozzle, and more particularly to a gas-inlet module and a gas-inlet nozzle each having more than one channel.

BACKGROUND OF THE DISCLOSURE

A conventional wafer cassette carrying device includes a carrier that is configured to carry a wafer cassette. Two gas-inlet nozzles of the carrier are configured to implement a gas-filling process for an interior space of the wafer cassette, and two gas-outlet nozzles of the carrier are configured to implement a gas-suction process for the interior space of the wafer cassette. However, the conventional gas-inlet nozzle is limited by an existing structural design so as to be difficult to have an improvement.

SUMMARY OF THE DISCLOSURE

In response to the above-referenced technical inadequacies, the present disclosure provides a gas-inlet module and a gas-inlet nozzle to effectively improve on the issues associated with conventional gas-inlet nozzles.

In one aspect, the present disclosure provides a gas-inlet module, which includes at least one gas-inlet nozzle. The at least one gas-inlet nozzle has a first gas-inlet channel and a second gas-inlet channel. The first gas-inlet channel has a first end opening. The second gas-inlet channel has a second end opening, and a distance between a center point of the second end opening and a center point of the first end opening is defined as an offset distance. Moreover, a value defined by an inner radius of the first end opening or an inner radius of the second end opening divided by the offset distance is within a range from 1/7 to 5/7.

In another aspect, the present disclosure provides a gas-inlet nozzle having an inherently one-piece structure. The gas-inlet nozzle includes a first airtight structure, a second airtight structure, a first gas-inlet channel, and a second gas-inlet channel. The first airtight structure is arranged on a top portion of the gas-inlet nozzle and has a first arc boundary. The first arc boundary has a center of a first circle and a first radius. The second airtight structure is arranged on the top portion of the gas-inlet nozzle and has a second arc boundary. The second arc boundary has a center of a second circle and a second radius. The first arc boundary is connected to the second arc boundary so as to jointly define an outer airtight boundary, and the center of the first circle is spaced apart from the center of the second circle by an offset distance. The first gas-inlet channel has a first end opening. The first gas-inlet channel extends from the center of the first circle to penetrate through the gas-inlet nozzle. The second gas-inlet channel has a second end opening. The second gas-inlet channel extends from the center of the second circle to penetrate through the corresponding gas-inlet nozzle. Moreover, a value defined by an inner radius of the first end opening or an inner radius of the second end opening divided by the offset distance is within a range from 1/7 to 5/7.

Therefore, the gas-inlet module provided by the present disclosure has the dual-channel structure with a specific condition (e.g., the value defined by the inner radius of the first end opening or the inner radius of the second end opening divided by the offset distance is within a range from 1/7 to 5/7), thereby effectively expanding the application of gas-inlet nozzle.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
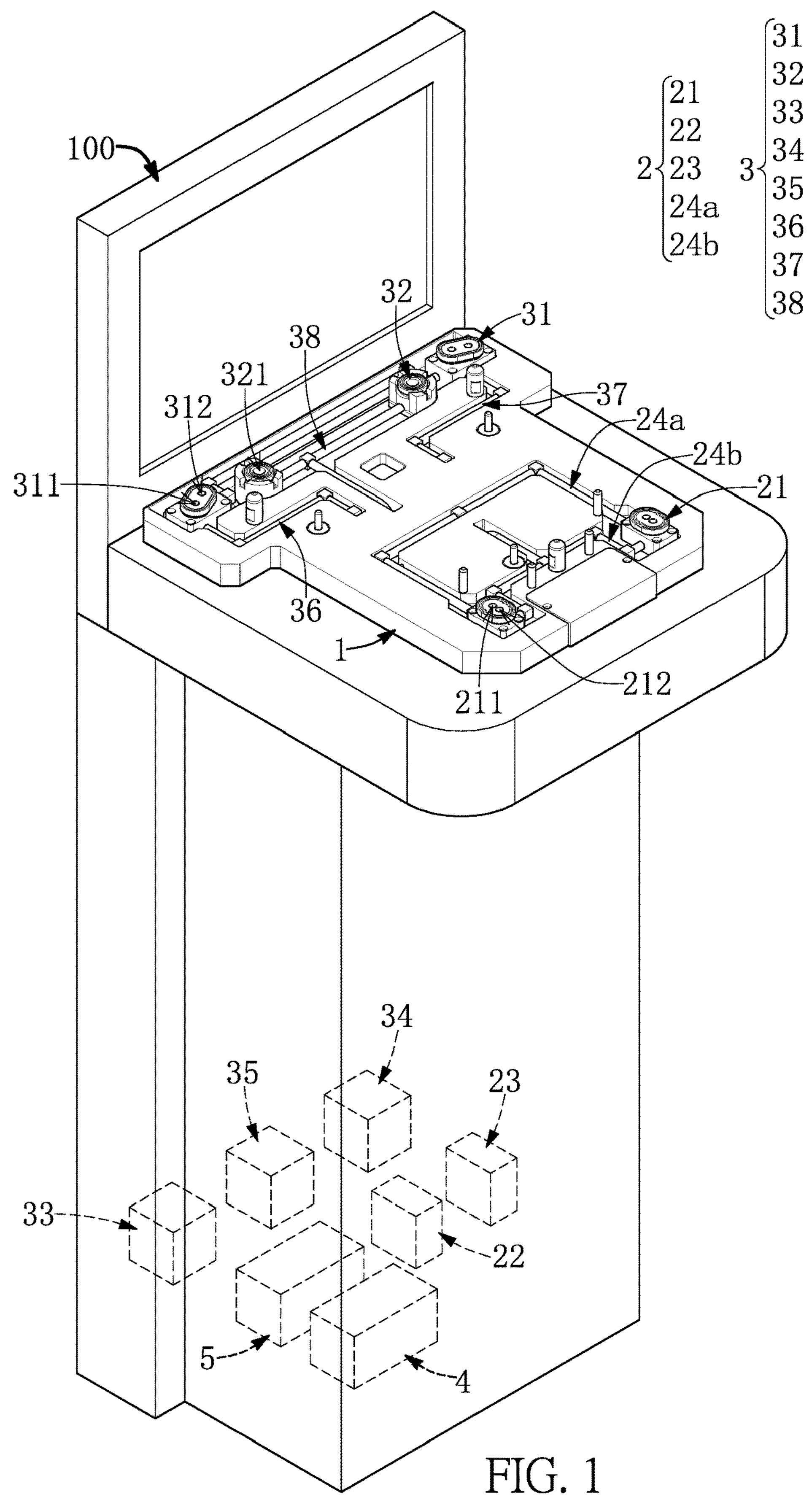
FIG. 1 is a perspective view of a load port according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as “first”, “second” or “third” can be used to describe various components, signals or the like, which are for distinguishing one component/signal from another one only, and are not intended to, nor should be construed to impose any substantive limitations on the components, signals or the like.

Referring to FIG. 1 to FIG. 11, a first embodiment of the present disclosure provides a load port 100. As shown in FIG. 1 to FIG. 4, the load port 100 is configured for selectively carrying one of wafer cassettes different from each other. The wafer cassettes in the present embodiment include a first wafer cassette W1, a second wafer cassette W2, and a third wafer cassette W, which are different from each other, but the present disclosure is not limited thereto.

Figure 5:
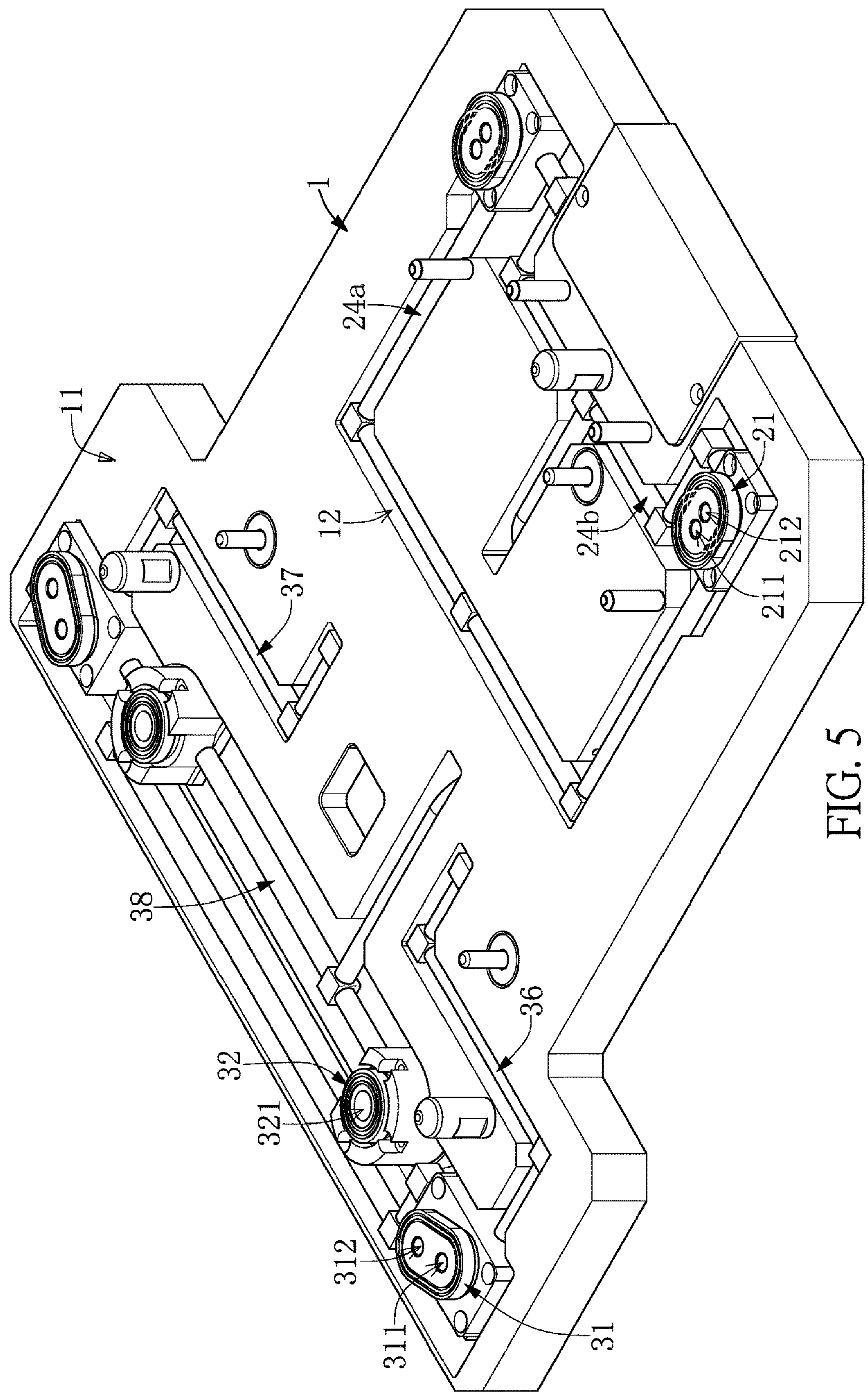
FIG. 5 is a perspective view showing a carrying board and components disposed thereon according to the embodiment of the present disclosure.
Figure 6:
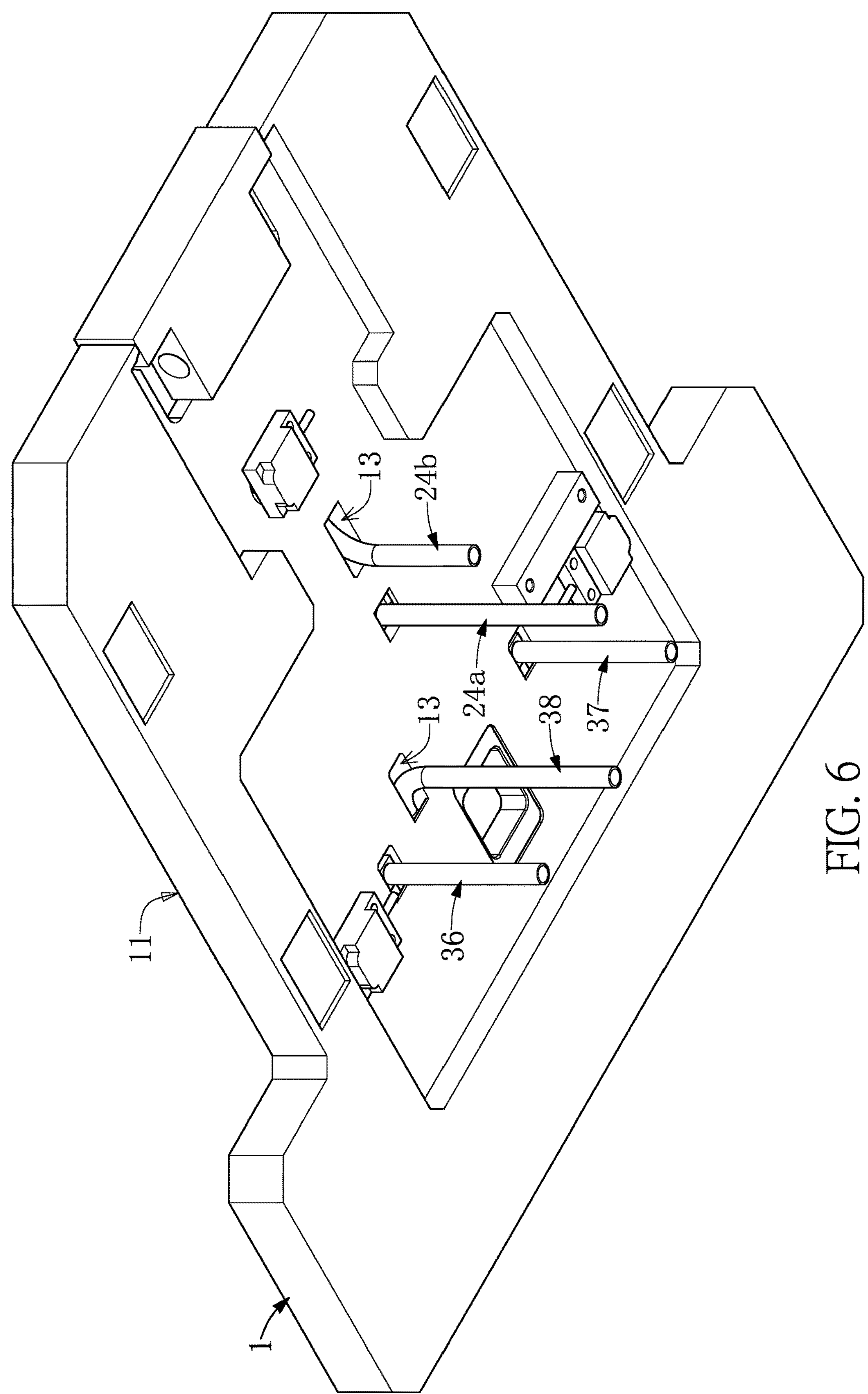
FIG. 6 is a perspective view showing the carrying board and the components disposed thereon from another angle of view according to the embodiment of the present disclosure.
Figure 7:
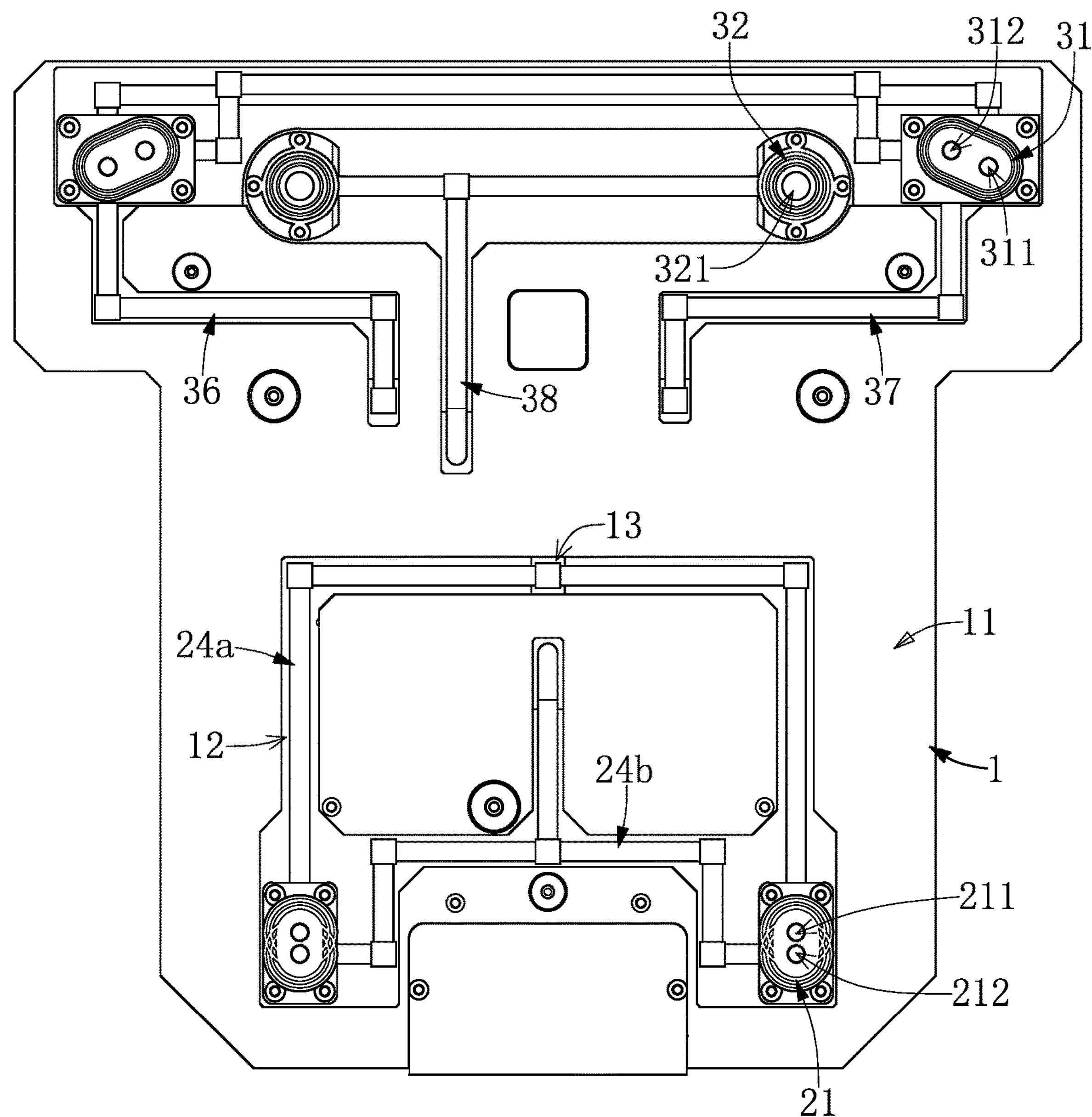
FIG. 7 is a top view of FIG. 5.

As shown in FIG. 1, FIG. 5, and FIG. 6, the load port 100 includes a carrying board 1, a gas-inlet module 2 assembled to one side of the carrying board 1, a gas-outlet module 3 assembled to the opposite side of the carrying board 1, a gas-filling module 4 connected to the gas-inlet module 2, and a gas-suction module 5 connected to the gas-outlet module 3, but the present disclosure is not limited thereto. For example, in other embodiments of the present disclosure not shown in the drawings, the gas-filling module 4 and the gas-suction module 5 can be external components that are located outside of and additionally assembled to the load port 100.

The carrying board 1 has a carrying side 11 (e.g., a top surface of the carrying board 1 shown in FIG. 5), the carrying board 1 can be structurally designed according to assembling requirements of the gas-inlet module 2 and the gas-outlet module 3, and the carrying board 1 can further have alignment mechanisms (not labeled in the drawings) for the wafer cassettes, but the present disclosure is not limited thereto.

The gas-inlet module 2 includes two gas-inlet nozzles 21, a shared gas-inlet valve 22, an independent gas-inlet valve 23, and two gas-inlet pipes 24*a*, 24*b*. The two gas-inlet nozzles 21 are disposed on the carrying side 11 of the carrying board 1. Each of the two gas-inlet nozzles 21 in the present embodiment has an inherent one-piece structure, and has a shared gas-inlet channel 211 (i.e., a first gas-inlet channel 211) and an independent gas-inlet channel 212 (i.e., a second gas-inlet channel 212) that is spaced apart from the shared gas-inlet channel 211. In other words, each of the two gas-inlet nozzles 21 has a structural design with dual-channel, but the present disclosure is not limited thereto. For example, in other embodiments of the present disclosure not shown in the drawings, any one of the two gas-inlet nozzles 21 can be not integrally formed as a single one-piece structure; or, the shared gas-inlet channels 211 are formed in one of the two gas-inlet nozzles 21, and the independent gas-inlet channels 212 are formed in the other one of the two gas-inlet nozzles 21; or, the carrying board 1 is provided with four gas-inlet nozzles 21 assembled to one side thereof. Each of the four gas-inlet nozzles 21 includes a shared gas-inlet channel 211 or an independent gas-inlet channel 212.

The shared gas-inlet valve 22 and the independent gas-inlet valve 23 are located under the carrying board 1 and are connected to the gas-filling module 4. The shared gas-inlet valve 22 is in spatial communication with the shared gas-inlet channels 211 of the two gas-inlet nozzles 21, and the independent gas-inlet valve 23 is in spatial communication with the independent gas-inlet channels 212 of the two gas-inlet nozzles 21.

In the present embodiment, the shared gas-inlet valve 22 is in spatial communication with the shared gas-inlet channels 211 of the two gas-inlet nozzles 21 through one of the two gas-inlet pipes 24*a*, 24*b* (e.g., the gas-inlet pipe 24*a*), and the independent gas-inlet valve 23 is in spatial communication with the independent gas-inlet channels 212 of the two gas-inlet nozzles 21 through the other one of the two gas-inlet pipes 24*a*, 24*b* (e.g., the gas-inlet pipe 24*b*).

The gas-outlet module 3 includes two gas-outlet nozzles 31, two independent gas-outlet nozzles 32, a first gas-outlet valve 33, a second gas-outlet valve 34, a third gas-outlet valve 35, a first gas-outlet pipe 36, a second gas-outlet pipe 37, and a third gas-outlet valve 38. The two gas-outlet nozzles 31 and the two independent gas-outlet nozzles 32 are disposed on the carrying side 11 of the carrying board 1, and the independent gas-outlet nozzles 32 are located between the two gas-outlet nozzles 31.

It should be noted that the two gas-inlet nozzles 21 and the two gas-outlet nozzles 31 are respectively located at four corners of the carrying side 11 of the carrying board 1, but the present disclosure is not limited thereto.

Figure 2:
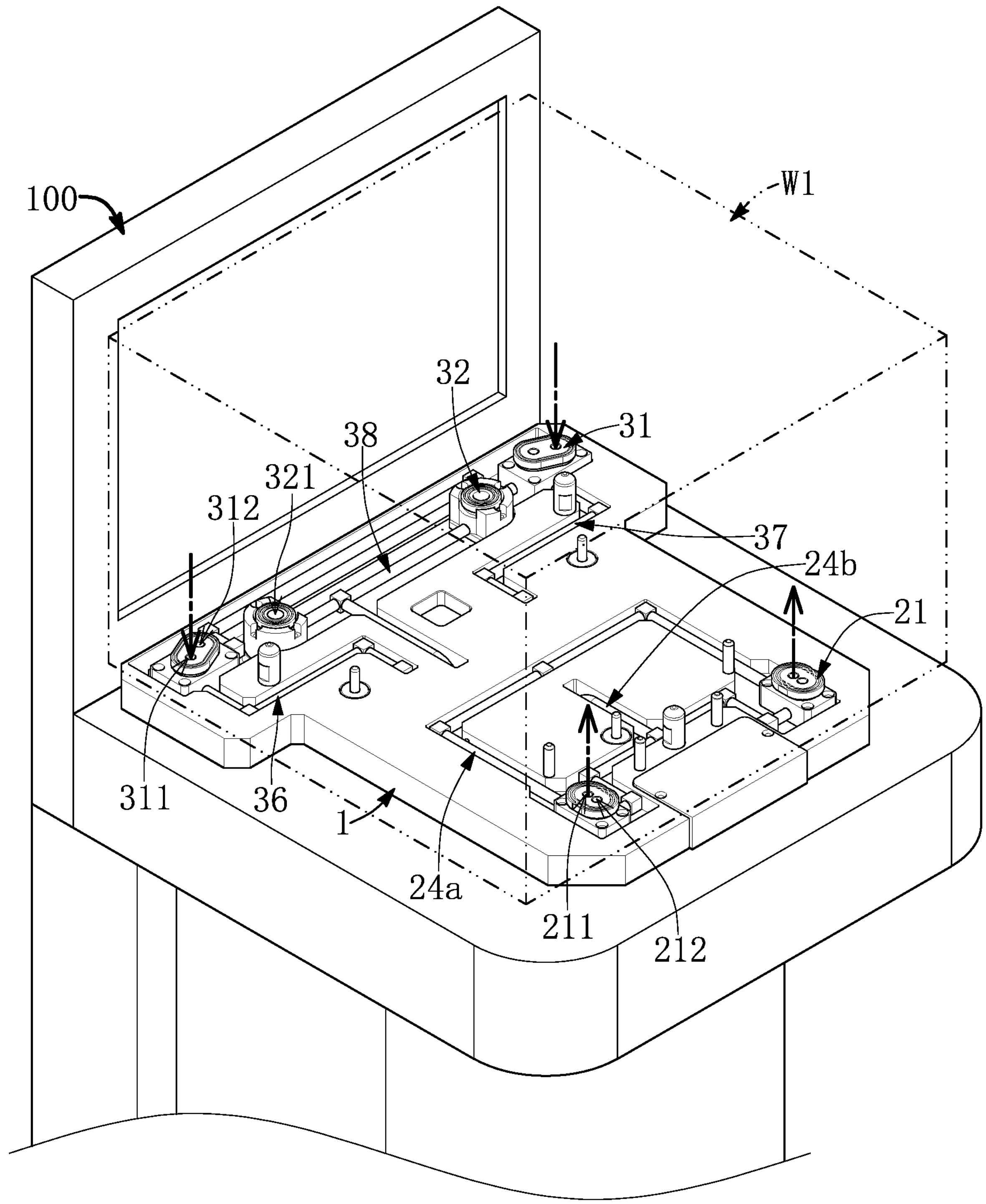
FIG. 2 is a perspective view showing the load port of FIG. 1 used to carry a first wafer cassette.
Figure 3:
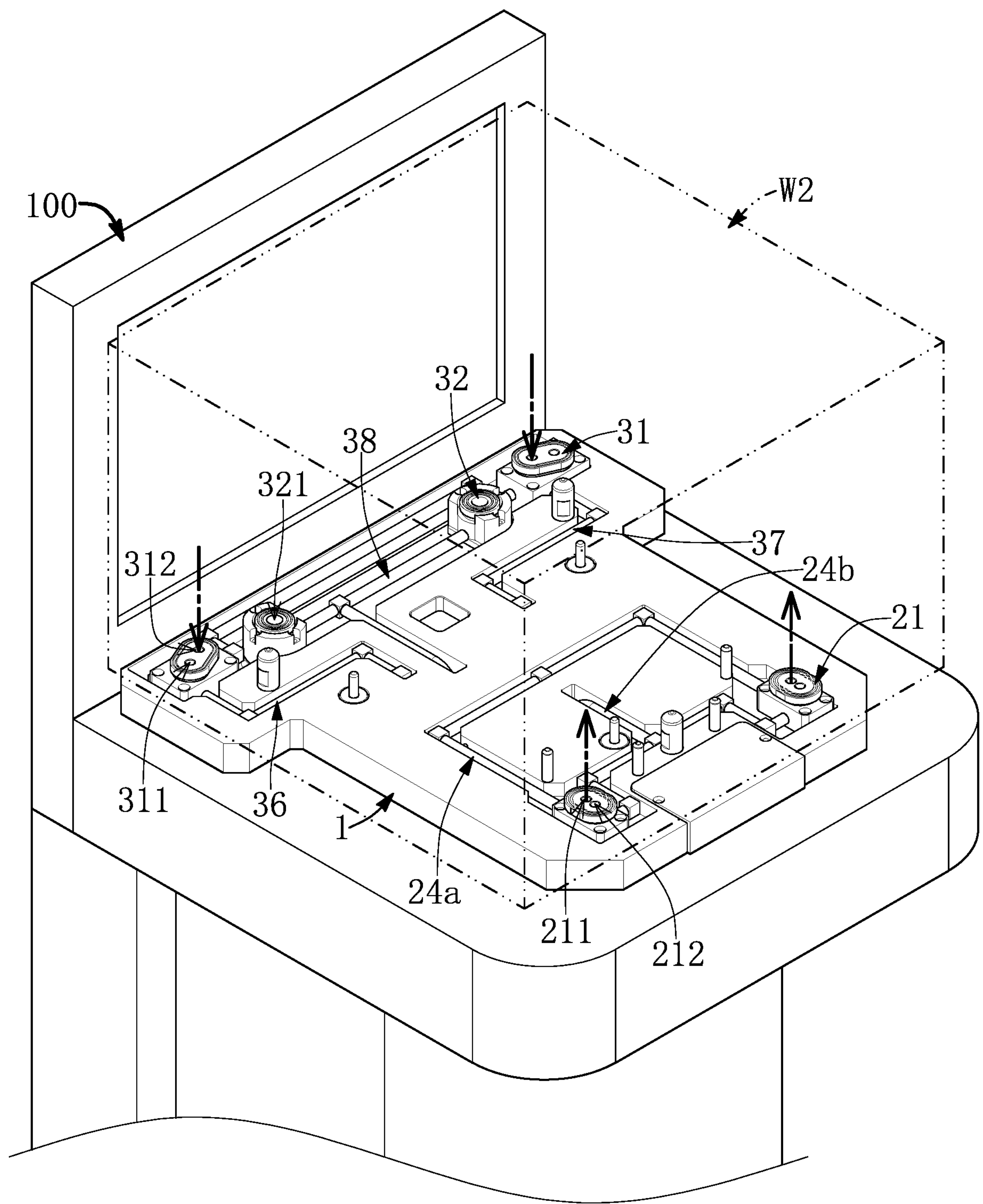
FIG. 3 is a perspective view showing the load port of FIG. 1 used to carry a second wafer cassette.

In summary, as shown in FIG. 1 to FIG. 3, the shared gas-inlet channels 211 of the two gas-inlet nozzles 21 are selectively cooperated with first gas-outlet channels 311 of the two gas-outlet nozzles 31 so as to be jointly configured to spatially communicate with an interior space of the first wafer cassette W1. Moreover, the shared gas-inlet channels 211 of the two gas-inlet nozzles 21 are selectively cooperated with second gas-outlet channels 312 of the two gas-outlet nozzles 31 so as to be jointly configured to spatially communicate with an interior space of the second wafer cassette W2. In other words, the two shared gas-inlet channels 211 arranged on one side of the carrying board 1 can be cooperated with the four gas-outlet channels (e.g., the two first gas-outlet channels 311 and the two second gas-outlet channels 312) arranged on the opposite side of the carrying board 1 so as to be jointly configured to spatially communicate with the interior of the first wafer cassette W1 or the interior space of the second wafer cassette W2.

Accordingly, in the load port 100 provided by the present embodiment of the present disclosure, each of the two gas-outlet nozzles 31 is integrally formed as a single one-piece structure with dual-channel, and the two gas-outlet nozzles 31 are cooperated with the shared gas-inlet channels 211 of the two gas-inlet nozzles 21 through the first gas-outlet channels 311 and the second gas-outlet channels 312, so that the two gas-outlet nozzles 31 and the two gas-inlet nozzles 21 can be applied to the carrying board 1 having a limiting size for implementing any one of a gas-filling process and a gas-suction process to the first wafer cassette W1 or the second wafer cassette W2, selectively.

Specifically, the gas-filling module 4 can be used to selectively fill gas into the interior space of the first wafer cassette W1 or the interior space of the second wafer cassette W2 through the shared gas-inlet valve 22, the corresponding gas-inlet pipe 24*a*, and the shared gas-inlet channels 211 of the two gas-inlet nozzles 21.

Moreover, the gas-suction module 5 can be used to suction gas from the interior space of the first wafer cassette W1 through the first gas-outlet valve 33, the first gas-outlet pipe 36, and the first gas-outlet channels 311 of the two gas-outlet nozzles 31. Furthermore, the gas-suction module 5 can be used to suction gas from the interior space of the second wafer cassette W2 through the second gas-outlet valve 34, the second gas-outlet pipe 37, and the second gas-outlet channels 312 of the two gas-outlet nozzles 31.

Figure 4:
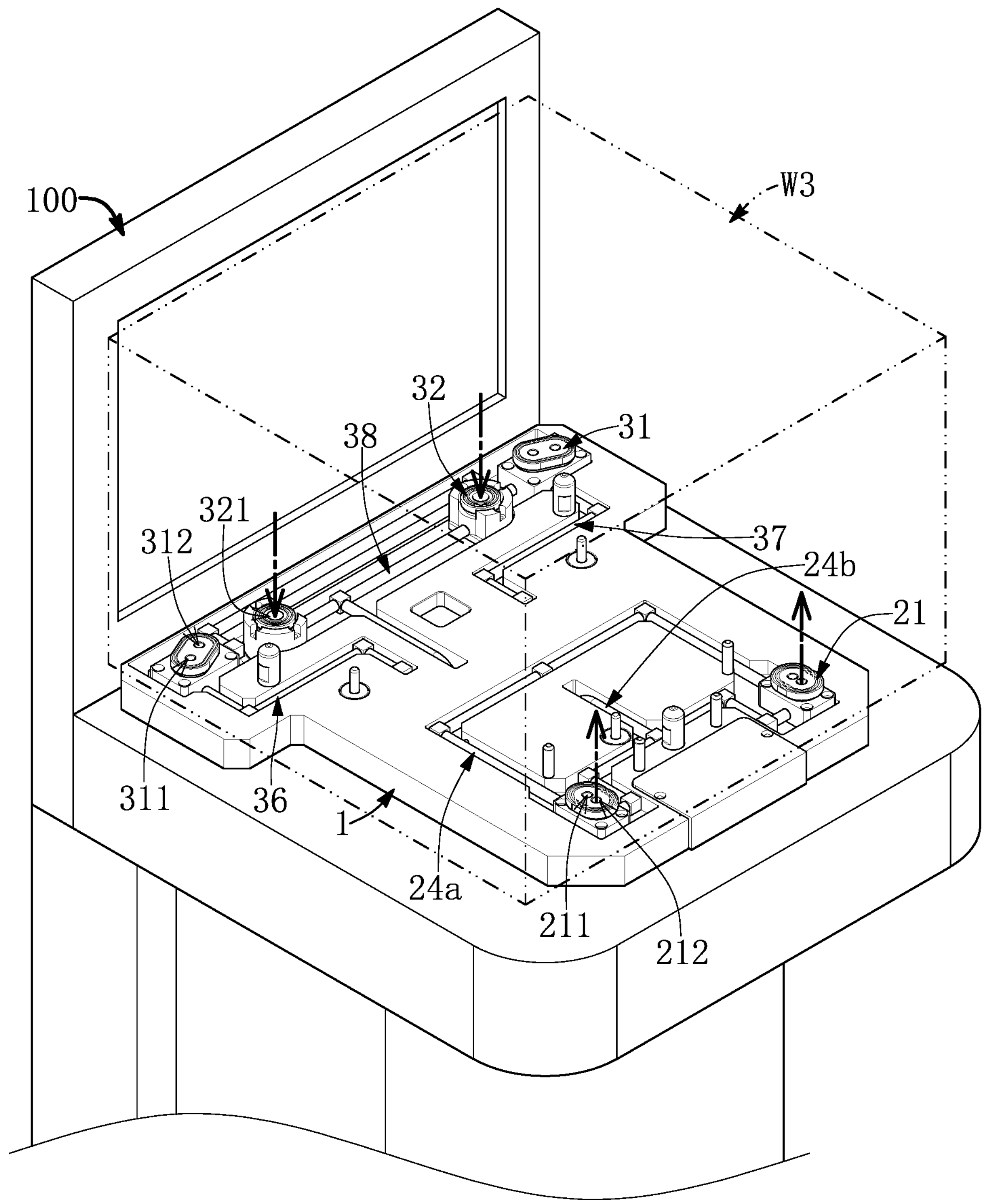
FIG. 4 is a perspective view showing the load port of FIG. 1 used to carry a third wafer cassette.

In addition, as shown in FIG. 1 and FIG. 4, the independent gas-inlet channels 212 of the gas-inlet nozzles 21 are cooperated with third gas-outlet channels 321 of the two independent gas-outlet nozzles 32 so as to be jointly configured to carry the third wafer cassette W3 and to spatially communicate with an interior space of the third wafer cassette W3. In other words, the four gas-inlet channels arranged on one side of the carrying board 1 (e.g., the two shared gas-inlet channels 211 and the two independent gas-inlet channels 212) are cooperated with the six gas-outlet channels arranged on the opposite side of the carrying board 1 (e.g., the two first gas-outlet channels 311, the two second gas-outlet channels 312, and the two third gas-outlet channels 321) so as to be jointly configured to spatially communicate with the interior space of the first wafer cassette W1, the second wafer cassette W2, or the third wafer cassette W3, selectively.

Accordingly, in the load port 100 provided by the present embodiment of the present disclosure, each of the two gas-inlet nozzles 21 is integrally formed as a single one-piece structure with dual-channel (e.g., the shared gas-inlet channel 211 and the independent gas-inlet channel 212), and the two gas-inlet nozzles 21 can be cooperated with the third gas-outlet channels 321 of the two independent gas-outlet nozzles 32 through the independent gas-inlet channels 212, so that the two gas-inlet nozzles 21 and the two independent gas-outlet nozzles 32 can be applied to the carrying board 1 having a limiting size for implementing any one of a gas-filling process and a gas-suction process to the third wafer cassette W3, but the present disclosure is not limited thereto. For example, in other embodiments of the present disclosure not shown in the drawings, any one of the two gas-inlet nozzles 21 can be not integrally formed as a single one-piece structure.

Specifically, the gas-filling module 4 can be used to fill gas into the interior space of the third wafer cassette W3 through the independent gas-inlet valve 23, the corresponding gas-inlet pipe 24*b*, and the independent gas-inlet channels 212 of the two gas-inlet nozzles 21. Moreover, the gas-suction module 5 can be used to suction gas from the interior space of the third wafer cassette W3 through the third gas-outlet valve 35, the third gas-outlet pipe 38, and the third gas-outlet channels 321 of the two independent gas-outlet nozzles 32.

It should be noted that the carrying board 1 and the nozzles (e.g., the two gas-inlet nozzles 21, the two gas-outlet nozzles 31, and the two independent gas-outlet nozzles 32) disposed thereon in the present embodiment can be jointly defined as a multi-use carrier. Moreover, in other embodiments of the present disclosure not shown in the drawings, the multi-use carrier can be independently used (e.g., sold) or can be used in cooperation with other components.

Furthermore, the multi-use carrier provided by the present disclosure can be used for the wafer cassettes in N number of models. Specifically, N is a positive integer, and N in the present embodiment is three.

In the present embodiment, the structural arrangement and the cooperation of the gas-inlet module 2 and the gas-outlet module 3 are described as the above description, but the present disclosure is not limited thereto. For example, in other embodiments of the present disclosure not shown in the drawings, at least one of the independent gas-inlet valve 23, the two gas-inlet pipes 24*a*, 24*b*, the two independent gas-outlet nozzles 32, the third gas-outlet valve 35, the first gas-outlet pipe 36, the second gas-outlet pipe 37, and the third gas-outlet pipe 38 can be omitted or can be replaced by other components according to design requirements.

The above description describes the configuration of the load port 100, but each of the two gas-inlet nozzles 21 having dual-channel (e.g., the shared gas-inlet channel 211 and the independent gas-inlet channel 212) needs to meet a high airtight requirement. Accordingly, any one of the two gas-inlet nozzles 21 in the present embodiment can utilize the dual-channel to be a part of an airtight structure by the following structural designs, thereby meeting the high airtight requirement.

Figure 8:
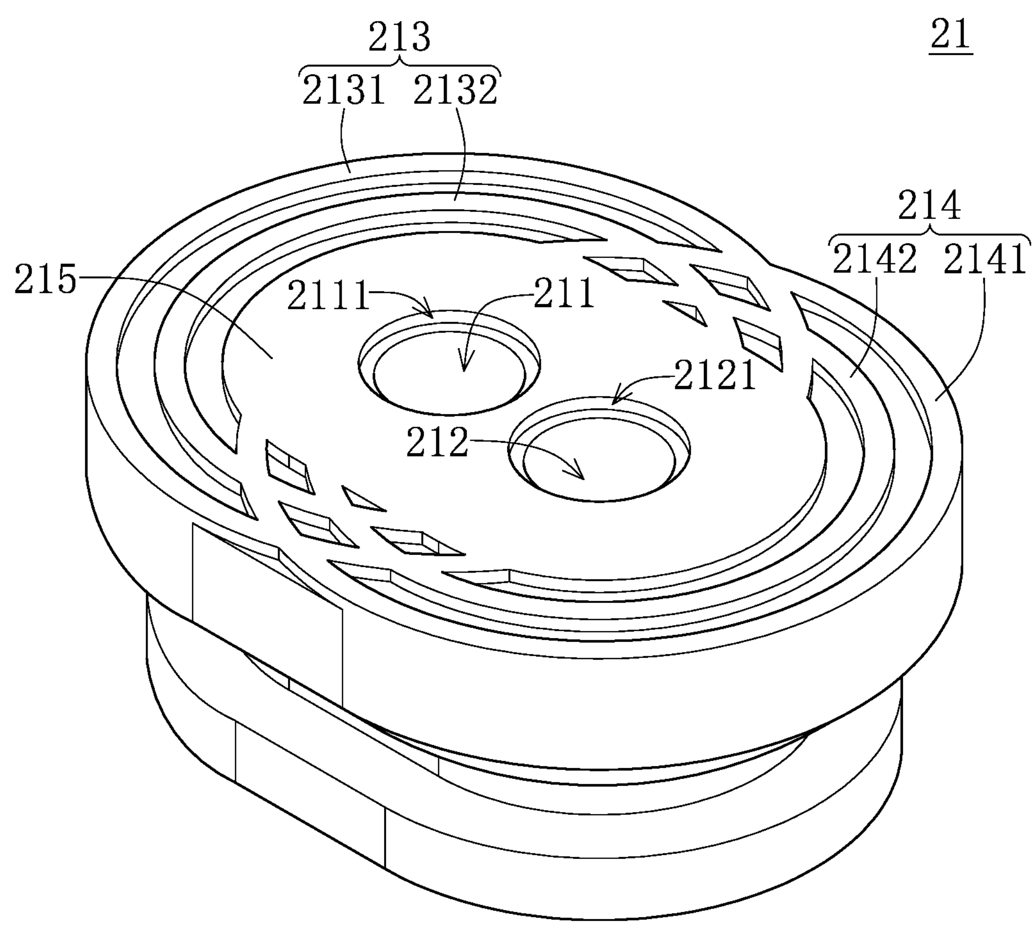
FIG. 8 is a perspective view showing a gas-inlet nozzle of FIG. 5.
Figure 9:
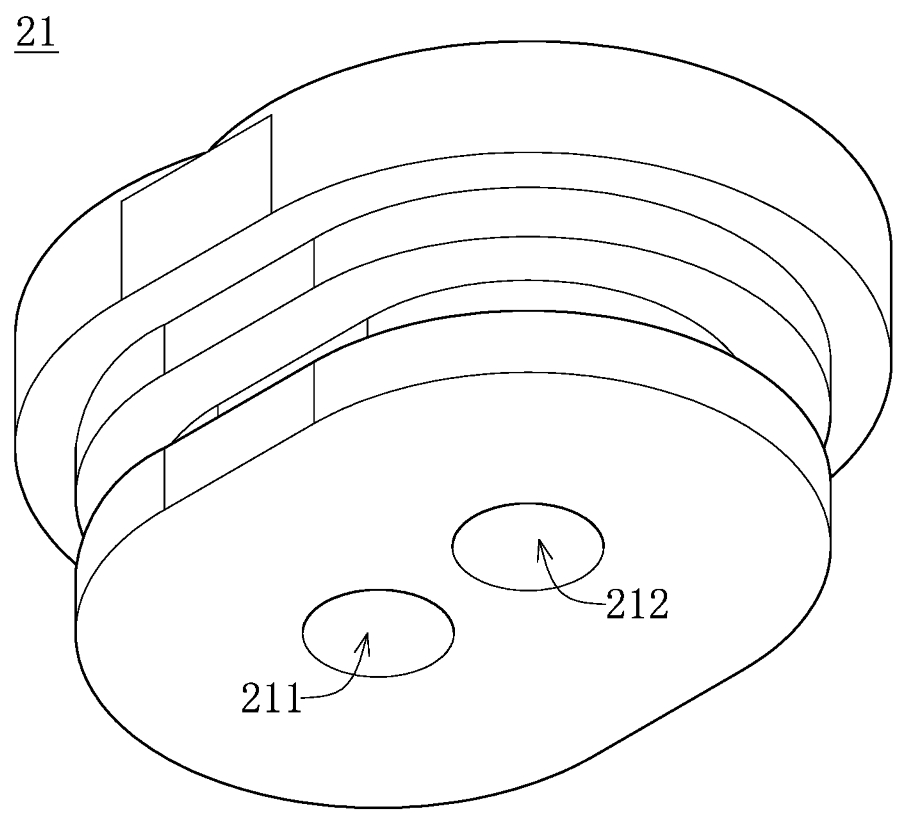
FIG. 9 is a perspective view showing the gas-inlet nozzle of FIG. 8 from another angle of view.

As shown in FIG. 8 and FIG. 9, as the two gas-inlet nozzles 21 in the present embodiment are of the substantially same structure, the following description discloses the structure of just one of the two gas-inlet nozzles 21 for the sake of brevity, but the present disclosure is not limited thereto. For example, in other embodiments of the present disclosure not shown in the drawings, the two gas-inlet nozzles 21 can be of different structures; or, the gas-inlet nozzle 21 can be independently used (e.g., sold) or can be used in cooperation with other components.

In the present embodiment, the shared gas-inlet channel 211 can be referred to a first gas-inlet channel 211, the independent gas-inlet channel 212 can be referred to a second gas-inlet channel 212, and each of the shared gas-inlet valve 22 and the independent gas-inlet valve 23 can be referred to a gas-inlet valve 22, 23. In other words, one of the two gas-inlet valves 22, 23 (e.g., the shared gas-inlet valve 22) is in spatial communication with the first gas-inlet channels 211 of the two gas-inlet nozzles 21, and the other one of the two gas-inlet valves 22, 23 (e.g., the independent gas-inlet valve 23) is in spatial communication with the second gas-inlet channels 212 of the two gas-inlet nozzles 21.

Figure 10:
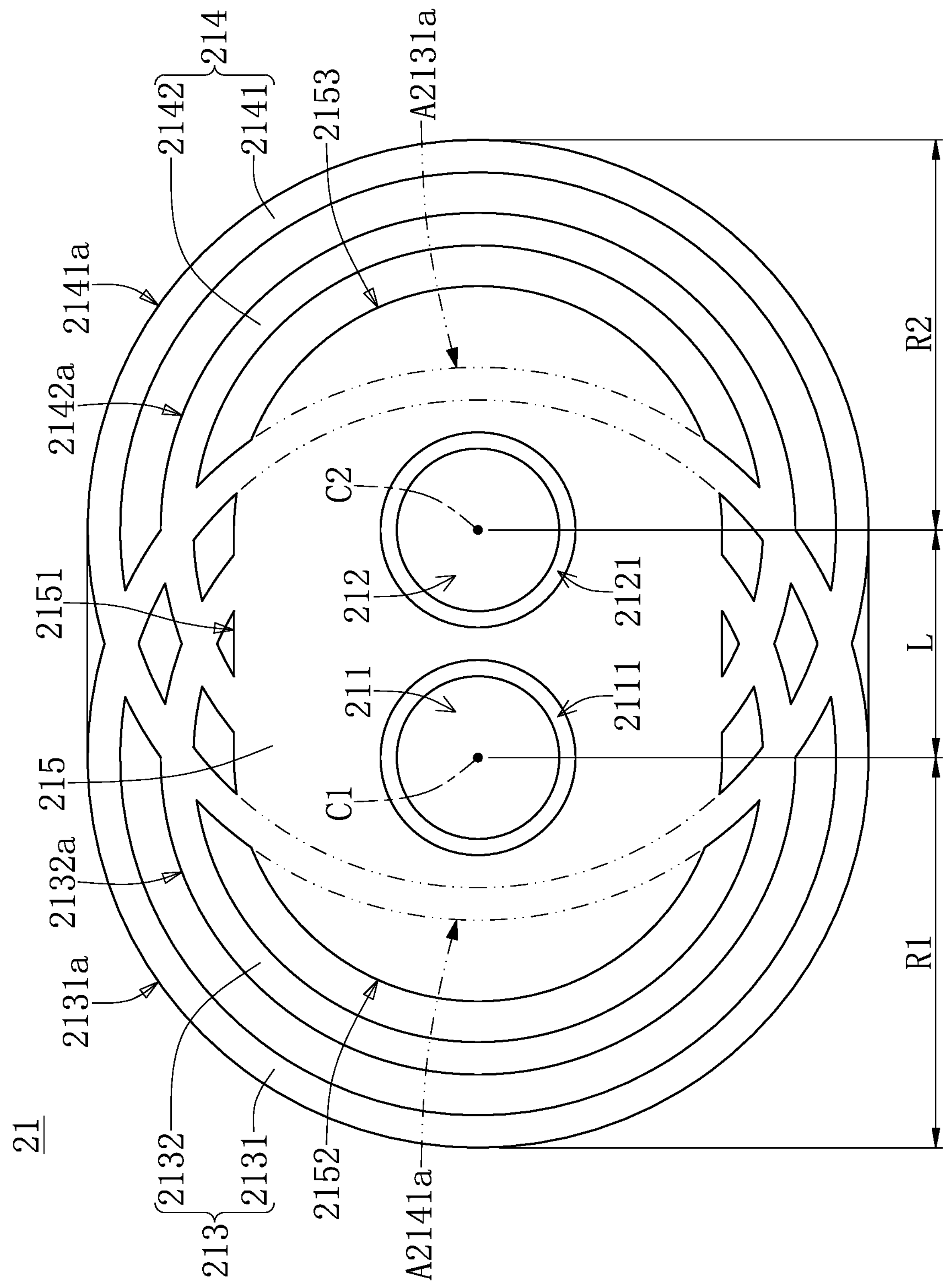
FIG. 10 is a planar top view of FIG. 8 for depicting a first outer circular region and a second outer circular region.
Figure 11:
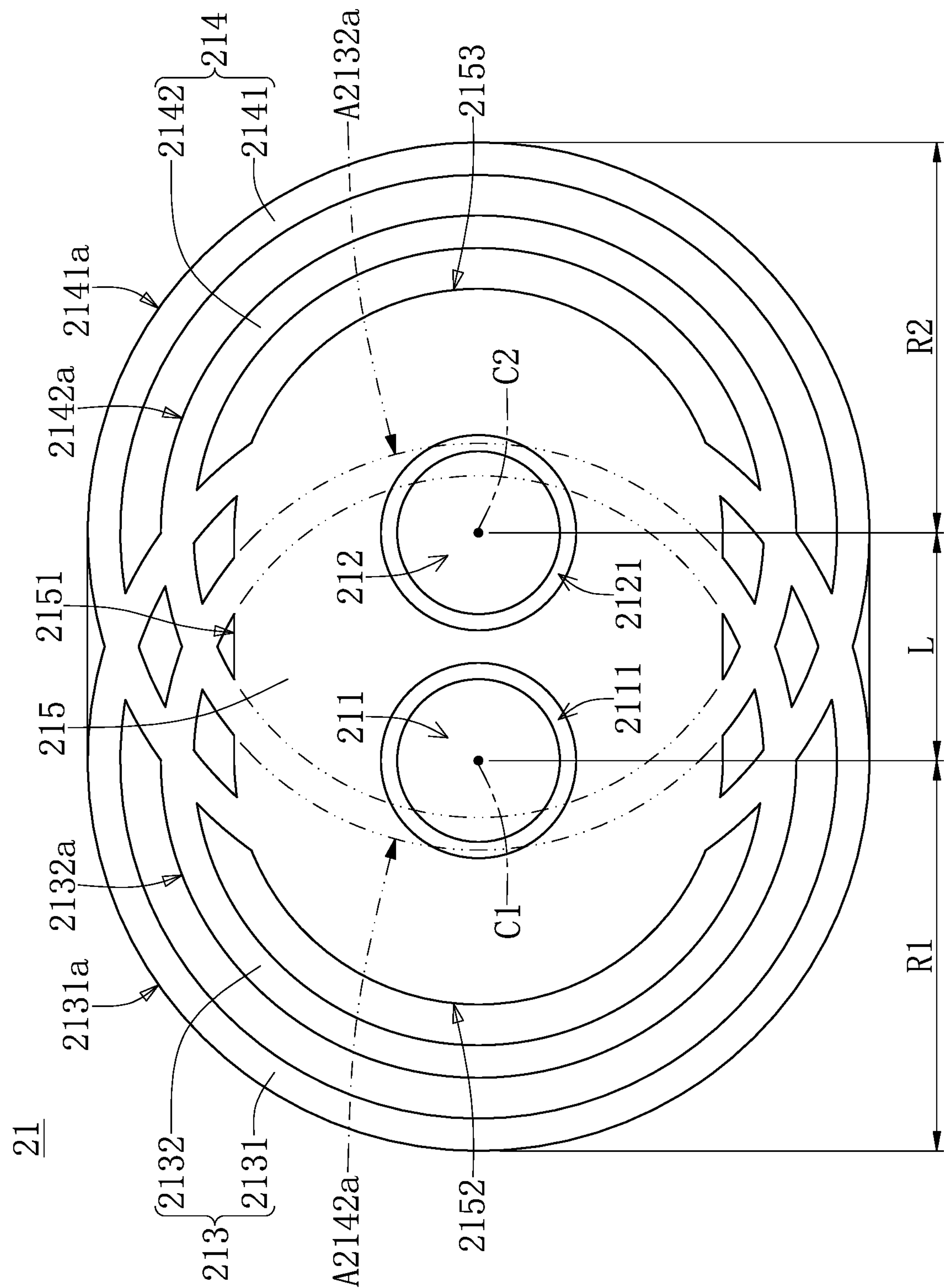
FIG. 11 is a planar top view of FIG. 8 for depicting a first inner circular region and a second inner circular region.

As shown in FIG. 8, FIG. 10, and FIG. 11, a top portion of the gas-inlet nozzle 21 in the present embodiment includes a first airtight structure 213, a second airtight structure 214 connected to the first airtight structure 213, and a carrying stage 215 that is arranged inside of the first airtight structure 213 and the second airtight structure 214. In the present embodiment, a top edge of the first airtight structure 213, a top edge of the second airtight structure 214, and a top edge of the carrying stage 215 are coplanar with each other, and are configured to be gaplessly abutted against any one of the first wafer cassette W1, the second wafer cassette W2, and the third wafer cassette W3.

Moreover, the gas-inlet nozzle 21 can be a mirror-symmetrical structure (e.g., the first airtight structure 213 and the second airtight structure 214 are symmetrical to each other), but the present disclosure is not limited thereto. For example, in other embodiments of the present disclosure not shown in the drawings, the first airtight structure 213 and the second airtight structure 214 of the gas-inlet nozzle 21 can be of different structures; or, the carrying stage 215 of the gas-inlet nozzle 21 can be omitted or can be replaced by other components; or, the gas-inlet nozzle 21 can be formed with just one airtight structure having an outer airtight boundary.

Specifically, the first airtight structure 213 includes a first outer C-shaped rib 2131 and a first inner C-shaped rib 2132 that is spaced apart from or parallel to the first outer C-shaped rib 2131. The first inner C-shaped rib 2132 is located between the first outer C-shaped rib 2131 and the carrying stage 215. Furthermore, two ends of the first outer C-shaped rib 2131 are connected to the carrying stage 215, and an outer edge of the first outer C-shaped rib 2131 defines a first arc boundary 2131*a* that has a center of a first circle C1 and a first radius R1. Two ends of the first inner C-shaped rib 2132 are connected to the carrying stage 215, and the first inner C-shaped rib 2132 has a center of a circle that is overlapped with the center of the first circle C1.

Moreover, the second airtight structure 214 includes a second outer C-shaped rib 2141 and a second inner C-shaped rib 2142 that is spaced apart from or parallel to the second outer C-shaped rib 2141. The second inner C-shaped rib 2142 is located between the second outer C-shaped rib 2141 and the carrying stage 215. Furthermore, two ends of the second outer C-shaped rib 2141 are connected to the carrying stage 215, and an outer edge of the second outer C-shaped rib 2141 defines a second arc boundary 2141*a* that has a center of a second circle C2 and a second radius R2. Two ends of the second inner C-shaped rib 2142 are connected to the carrying stage 215, and the second inner C-shaped rib 2142 has a center of a circle that is overlapped with the center of the second circle C2.

Specifically, the first outer C-shaped rib 2131 is connected to (or intersected with) the second outer C-shaped rib 2141 and the second inner C-shaped rib 2142, and the first arc boundary 2131*a* is connected to the second arc boundary 2141*a* so as to jointly define an outer airtight boundary. Moreover, the first inner C-shaped rib 2132 is connected to (or intersected with) the second outer C-shaped rib 2141 and the second inner C-shaped rib 2142, and an outer edge 2132*a* of the first inner C-shaped rib 2132 is connected to an outer edge 2142*a* of the second inner C-shaped rib 2142 so as to jointly define an inner airtight boundary. Any one of a first end opening 2111 of the first gas-inlet channel 211 and a second end opening 2121 of the second gas-inlet channel 212 in the present embodiment is a circular hole, so that the C-shaped ribs (e.g., the first outer C-shaped rib 2131, the first inner C-shaped rib 2132, the second outer C-shaped rib 2141, and the second inner C-shaped rib 2142) can provide a better airtight effect.

The center of the first circle C1 is spaced apart from the center of the second circle C2 by an offset distance L that is less than the first radius R1 and that is less than the second radius R2, but the present disclosure is not limited thereto. In the present embodiment, the first radius R1 is equal to the second radius R2, and the offset distance L is preferably within a range from 55% to 60% of the first radius R1. In other embodiments of the present disclosure not shown in the drawings, the offset distance L can be greater than at least one of the first radius R1 and the second radius R2.

In the present embodiment, the carrying stage 215 is located at an inner side of the outer airtight boundary and is also located at an inner side of the inner airtight boundary. An outer edge of the carrying stage 215 includes two straight edges 2151, a first arc edge 2152, and a second arc edge 2153. The two straight edges 2151 are parallel to each other, and the two straight edges 2151 are respectively connected to the two ends of the first inner C-shaped rib 2132 and are respectively connected to the two ends of the second inner C-shaped rib 2142.

Two ends of the first arc edge 2152 are respectively connected to one end of the two straight edges 2151 and are respectively connected to the two ends of the second outer C-shaped rib 2141 (e.g., any one of the two ends of the second outer C-shaped rib 2141 is connected to a junction of the first arc edge 2152 and the corresponding straight edge 2151). Specifically, the first arc edge 2152 has a center of a circle that is overlapped with the center of the first circle C1, and any two of the first arc edge 2152, the outer edge 2132*a* of the first inner C-shaped rib 2132, and the first arc boundary 2131*a* adjacent to each other are spaced apart from each other by a same distance, but the present disclosure is not limited thereto (e.g., the first arc edge 2152, the outer edge 2132*a*, and the first arc boundary 2131*a* can be spaced apart from each other by different distances).

Two ends of the second arc edge 2153 are respectively connected to another one end of the two straight edges 2151 and are respectively connected to the two ends of the first outer C-shaped rib 2131 (e.g., any one of the two ends of the first outer C-shaped rib 2131 is connected to a junction of the second arc edge 2153 and the corresponding straight edge 2151). Specifically, the second arc edge 2153 has a center of a circle that is overlapped with the center of the second circle C2, and any two of the second arc edge 2153, the outer edge 2142*a* of the second inner C-shaped rib 2142, and the second arc boundary 2141*a* adjacent to each other are spaced apart from each other by a same distance, but the present disclosure is not limited thereto (e.g., the second arc edge 2153, the outer edge 2142*a*, and the second arc boundary 2141*a* can be spaced apart from each other by different distances).

The first gas-inlet channel 211 (i.e., the shared gas-inlet channel 211) extends from the center of the first circle C1 to penetrate through the gas-inlet nozzle 21, and the first end opening 2111 of the first gas-inlet channel 211 is arranged on the carrying stage 215. Moreover, the first end opening 2111 is at least partially located in a second outer circular region A2141*a* defined by the second arc boundary 2141*a*, and is at least partially located in a second inner circular region A2142*a* defined by the outer edge 2142*a* of the second inner C-shaped rib 2142.

The second gas-inlet channel 212 (i.e., the independent gas-inlet channel 212) extends from the center of the second circle C2 to penetrate through the gas-inlet nozzle 21, and the second end opening 2121 of the second gas-inlet channel 212 is arranged on the carrying stage 215. Moreover, the second end opening 2121 is at least partially located in a first outer circular region A2131*a* defined by the first arc boundary 2131*a*, and is at least partially located in a first inner circular region A2132*a* defined by the outer edge 2132*a* of the first inner C-shaped rib 2132.

In addition, the offset distance L of the present embodiment can be defined by a distance between a center point of the second end opening 2121 and a center point of the first end opening 2111, and a value defined by an inner radius of the first end opening 2111 (or an inner radius of the second end opening 2121) divided by the offset distance L is within a range from 1/7 to 5/7. For example, the inner radius of the first end opening 2111 or the inner radius of the second end opening 2121 can be within a range from 1 mm to 5 mm, and the offset distance L can be 7 mm.

Specifically, the first end opening 2111 and the second end opening 2121 are located in an overlapped region of the first outer circular region A2131*a* and the second outer circular region A2141*a*, and two end portions of the carrying stage 215 (e.g., the two end portions respectively have the first arc edge 2152 and the second arc edge 2153) are respectively located at two opposite sides of the overlapped region. Moreover, at least 90% area of any one of the first end opening 2111 and the second end opening 2121 is located in the overlapped region of the first inner circular region A2132*a* and the second inner circular region A2142*a*.

In summary, as shown in FIG. 1 to FIG. 3 and FIG. 10, when the top portions of the two gas-inlet nozzles 21 are abutted against the first wafer cassette W1 or the second wafer cassette W2, in each of the two gas-inlet nozzles 21, the shared gas-inlet channel 211 and the shared gas-inlet valve 22 are configured to allow an airflow to flow into the interior space of the first wafer cassette W1 or the second wafer cassette W2, and the independent gas-inlet channel 212 is cooperated with the independent gas-inlet valve 23, the outer airtight boundary, and the inner airtight boundary so as to jointly prevent the airflow from passing therethrough (e.g., the independent gas-inlet valve 23 is enclosed at this time).

Moreover, as shown in FIG. 1, FIG. 4, and FIG. 10, when the top portions of the two gas-inlet nozzles 21 are abutted against the third wafer cassette W3, in each of the two gas-inlet nozzles 21, the independent gas-inlet channel 212 and the independent gas-inlet valve 23 are configured to allow an airflow to flow into the interior space of the third wafer cassette W3, and the shared gas-inlet channel 211 is cooperated with the shared gas-inlet valve 22, the outer airtight boundary, and the inner airtight boundary so as to jointly prevent the airflow from passing therethrough (e.g., the shared gas-inlet valve 22 is enclosed at this time).

In summary, as shown in FIG. 1 to FIG. 4 and FIG. 10, when the top portions of the two gas-inlet nozzles 21 are abutted against one of the wafer cassettes, in each of the two gas-inlet nozzles 21, any one of the first gas-inlet channel 211 and the second gas-inlet channel 212 is cooperated with the corresponding gas-inlet valve 22, 23 so as to be jointly configured to allow an airflow to flow into an interior space of the one of the wafer cassettes, and the other one of the first gas-inlet channel 211 and the second gas-inlet channel 212 is cooperated with the corresponding gas-inlet valve 22, 23, the outer airtight boundary, and the inner airtight boundary so as to jointly prevent the airflow from passing therethrough.

Accordingly, the gas-inlet nozzle 21 in the present embodiment has the dual-channel structure and can be designed with the above structural arrangement on the top portion thereof (e.g., the first arc boundary 2131*a* is connected to the second arc boundary 2141*a* so as to jointly define the outer airtight boundary; the first end opening 2111 is at least partially located in the second outer circular region A2141*a*; and the second end opening 2121 is at least partially located in the first outer circular region A2131*a*), so that the shared gas-inlet channel 211 and the independent gas-inlet channel 212 can be used as airtight structures for each other, thereby meeting the high airtight requirement during the gas-filling process.

Beneficial Effects of the Embodiment

In conclusion, in the load port and the multi-use carrier provided by the present disclosure, the four gas-outlet channels and the two shared gas-inlet channels are cooperated with each other for being applied to the carrier having a limiting size, thereby being capable of implementing any one of the gas-filling process and the gas-suction process to the first wafer cassette or the second wafer cassette, selectively.

Moreover, the load port and the multi-use carrier provided by the present disclosure can further have the two independent gas-inlet channels arranged on the carrying board having the limiting size for being cooperated with the two third gas-outlet channels, thereby being capable of implementing any one of the gas-filling process and the gas-suction process to the third wafer cassette.

Furthermore, the gas-inlet module provided by the present disclosure has the dual-channel structure with a specific condition (e.g., the value defined by the inner radius of the first end opening or the inner radius of the second end opening divided by the offset distance is within a range from 1/7 to 5/7), thereby effectively expanding the application of the gas-inlet nozzle. Specifically, the gas-inlet module provided by the present disclosure has the dual-channel structure and can be designed with the above structural arrangement on the top portion thereof, so that the shared gas-inlet channel and the independent gas-inlet channel can be used as airtight structures for each other, thereby meeting the high airtight requirement during the gas-filling process.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A gas-inlet module, comprising:

at least one gas-inlet nozzle including:

a first gas-inlet channel having a first end opening; and a second gas-inlet channel having a second end opening, wherein a distance between a center point of the second end opening and a center point of the first end opening is defined as an offset distance;

wherein a value defined by an inner radius of the first end opening or an inner radius of the second end opening divided by the offset distance is within a range from 1/7 to 5/7;

wherein a quantity of the at least one gas-inlet nozzle is two, and a top portion of each of the two gas-inlet nozzles includes:

a first airtight structure having a first arc boundary, wherein the first arc boundary has a center of a first circle and a first radius; and a second airtight structure having a second arc boundary, wherein the second arc boundary has a center of a second circle and a second radius, and wherein the first arc boundary is connected to the second arc boundary so as to jointly define an outer airtight boundary, and the center of the first circle is spaced apart from the center of the second circle by the offset distance.

2. The gas-inlet module according to claim 1, further comprising:

two gas-inlet valves, wherein one of the two gas-inlet valves is in spatial communication with the first gas-inlet channels of the two gas-inlet nozzles, and the other one of the two gas-inlet valves is in spatial communication with the second gas-inlet channels of the two gas-inlet nozzles;

wherein, when the top portions of the two gas-inlet nozzles are abutted against a wafer cassette, in each of the two gas-inlet nozzles, one of the first gas-inlet channel and the second gas-inlet channel is cooperated with the corresponding gas-inlet valve so as to be jointly configured to allow an airflow to flow into an interior space of the wafer cassette, and the other one of the first gas-inlet channel and the second gas-inlet channel is cooperated with the corresponding gas-inlet valve and the outer airtight boundary so as to jointly prevent the airflow from passing therethrough.

3. The gas-inlet module according to claim 2, wherein, in each of the two gas-inlet nozzles, the first gas-inlet channel extends from the center of the first circle to penetrate through the corresponding gas-inlet nozzle, the first end opening is at least partially located in a second outer circular region defined by the second arc boundary, the second gas-inlet channel extends from the center of the second circle to penetrate through the corresponding gas-inlet nozzle, and the second end opening is at least partially located in a first outer circular region defined by the first arc boundary.

4. The gas-inlet module according to claim 2, wherein the top portion of each of the two gas-inlet nozzles includes a carrying stage located at an inner side of the outer airtight boundary, and wherein, in each of the two gas-inlet nozzles, the first end opening and the second end opening are arranged on the carrying stage.

5. The gas-inlet module according to claim 2, wherein, in each of the two gas-inlet nozzles, the first airtight structure includes a first outer C-shaped rib having the first arc boundary, the second airtight structure includes a second outer C-shaped rib having the second arc boundary, and two ends of the first outer C-shaped rib and two ends of the second outer C-shaped rib are connected to the carrying stage.

6. The gas-inlet module according to claim 5, wherein, in each of the two gas-inlet nozzles, the first airtight structure includes a first inner C-shaped rib arranged between the carrying stage and the first outer C-shaped rib, the first inner C-shaped rib has a center of circle that is overlapped with the center of the first circle, and the first inner C-shaped rib is connected to the second outer C-shaped rib, and wherein, in each of the two gas-inlet nozzles, the second airtight structure includes a second inner C-shaped rib arranged between the carrying stage and the second outer C-shaped rib, the second inner C-shaped rib has a center of circle that is overlapped with the center of the second circle, and the second inner C-shaped rib is connected to the first outer C-shaped rib.

7. The gas-inlet module according to claim 6, wherein, in each of the two gas-inlet nozzles, an outer edge of the first inner C-shaped rib is connected to an outer edge of the second inner C-shaped rib so as to jointly define an inner airtight boundary, the outer edge of the first inner C-shaped rib defines a first inner circular region, the outer edge of the second inner C-shaped rib defines a second inner circular region that is partially overlapped with the first inner circular region, and at least 90% area of any one of the first end opening and the second end opening is located in an overlapped region of the first inner circular region and the second inner circular region.

8. A gas-inlet nozzle having an inherent one-piece structure, comprising:

a first airtight structure arranged on a top portion of the gas-inlet nozzle and having a first arc boundary, wherein the first arc boundary has a center of a first circle and a first radius;

a second airtight structure arranged on the top portion of the gas-inlet nozzle and having a second arc boundary, wherein the second arc boundary has a center of a second circle and a second radius, and wherein the first arc boundary is connected to the second arc boundary so as to jointly define an outer airtight boundary, and the center of the first circle is spaced apart from the center of the second circle by an offset distance;

a first gas-inlet channel having a first end opening, wherein the first gas-inlet channel extends from the center of the first circle to penetrate through the gas-inlet nozzle; and a second gas-inlet channel having a second end opening, wherein the second gas-inlet channel extends from the center of the second circle to penetrate through the gas-inlet nozzle, and wherein a value defined by an inner radius of the first end opening or an inner radius of the second end opening divided by the offset distance is within a range from 1/7 to 5/7.

9. A gas-inlet module, comprising:

at least one gas-inlet nozzle including:

a first gas-inlet channel having a first end opening; and a second gas-inlet channel having a second end opening, wherein a distance between a center point of the second end opening and a center point of the first end opening is defined as an offset distance;

wherein a value defined by an inner radius of the first end opening or an inner radius of the second end opening divided by the offset distance is within a range from 1/7 to 5/7;

wherein the at least one gas-inlet nozzle includes at least one airtight structure arranged on a top portion thereof, and wherein the at least one airtight structure has an outer airtight boundary and surrounds the first gas-inlet channel and the second gas-inlet channel.

* * * * *